United States Patent
Bernards et al.

(10) Patent No.: US 6,946,027 B2
(45) Date of Patent: Sep. 20, 2005

(54) COMPOSITION AND METHOD FOR PREPARING CHEMICALLY-RESISTANT ROUGHENED COPPER SURFACES FOR BONDING TO SUBSTRATES

(75) Inventors: Roger F. Bernards, South Haven, MN (US); Joseph Stanton Bowers, Jr., Lakeville, MN (US); Benjamin T. Carroll, Brooklyn Park, MN (US); Alvin A. Kucera, Maple Grove, MN (US)

(73) Assignee: Electrochemicals, Inc., Maple Plain, MN (US)

( * ) Notice: Subject to any disclaimer, the term of this patent is extended or adjusted under 35 U.S.C. 154(b) by 0 days.

(21) Appl. No.: 10/782,177

(22) Filed: Feb. 17, 2004

(65) Prior Publication Data

US 2004/0159264 A1 Aug. 19, 2004

Related U.S. Application Data

(62) Division of application No. 10/143,389, filed on May 10, 2002, now Pat. No. 6,716,281.

(51) Int. Cl.$^7$ .................. C09K 13/00; C09K 13/06; B05D 3/10
(52) U.S. Cl. ............... 106/287.32; 106/287.23; 106/287.24; 106/287.3; 148/22; 252/79.1; 252/79.2; 252/79.4; 216/13; 216/105; 216/106
(58) Field of Search .................. 106/287.23, 287.24, 106/287.3, 287.32; 148/22; 252/79.1, 79.2, 79.4; 216/13, 105, 106

(56) References Cited

U.S. PATENT DOCUMENTS

| | | |
|---|---|---|
| 3,756,957 A | 9/1973 | Shiga |
| 4,236,957 A | 12/1980 | Valayil et al. |
| 4,512,818 A | 4/1985 | Valayil et al. |
| 4,642,161 A | 2/1987 | Akahoshi et al. |
| 5,006,200 A | 4/1991 | Chen |
| 5,073,456 A | 12/1991 | Palladino |
| 5,221,418 A | 6/1993 | Cordani |
| 5,492,595 A | 2/1996 | Carano et al. |
| 5,532,094 A | 7/1996 | Arimura et al. |
| 5,800,859 A | 9/1998 | Price et al. |
| 5,837,155 A | 11/1998 | Inagaki et al. |
| 5,861,076 A | 1/1999 | Adlam et al. |
| 5,869,130 A | 2/1999 | Ferrier |
| 5,931,996 A | 8/1999 | Reisser et al. |
| 5,985,998 A | 11/1999 | Sommerfeld et al. |
| 6,054,061 A | 4/2000 | Bayes et al. |
| 6,063,306 A | 5/2000 | Kaufman et al. |
| 6,117,795 A | 9/2000 | Pasch |
| 6,136,502 A | 10/2000 | Satoshi et al. |
| 6,146,701 A | 11/2000 | Ferrier |
| 6,162,503 A | 12/2000 | Ferrier |
| 6,464,893 B1 * | 10/2002 | Caldwell ............. 216/91 |
| 6,716,281 B2 | 4/2004 | Bernards et al. |
| 2001/0000884 A1 | 5/2001 | Miller et al. |
| 2002/0084441 A1 | 7/2002 | Bernards et al. |

FOREIGN PATENT DOCUMENTS

| | | |
|---|---|---|
| WO | WO 98/19217 | 5/1998 |
| WO | WO 99/40764 | 8/1999 |
| WO | WO 99/40765 | 8/1999 |
| WO | WO 01/29289 | 4/2001 |
| WO | WO 01/29290 | 4/2001 |

* cited by examiner

*Primary Examiner*—David Brunsman
(74) *Attorney, Agent, or Firm*—McAndrews, Held & Malloy, Ltd.

(57) ABSTRACT

The invention is directed to a method and composition for providing chemically-resistant roughened copper surfaces suitable for subsequent multilayer lamination. In one embodiment, a smooth copper surface is contacted with an adhesion promoting composition under conditions effective to provide a roughened copper surface, the adhesion promoting composition comprising an oxidizer, a pH adjuster, a topography modifier, and a sulfur-containing coating stabilizer. In another embodiment, a smooth copper surface is contacted with an adhesion promoting composition under conditions effective to provide a roughened copper surface, the adhesion promoting composition comprising an oxidizer, a pH adjuster, and a topography modifier. Then, in a subsequent step, the roughened copper surface is contacted with an acid resistance promoting composition.

46 Claims, No Drawings

COMPOSITION AND METHOD FOR PREPARING CHEMICALLY-RESISTANT ROUGHENED COPPER SURFACES FOR BONDING TO SUBSTRATES

CROSS-REFERENCE TO RELATED APPLICATIONS

This application is a divisional of and claims priority benefits from U.S. patent application Ser. No. 10/143,389 filed May 10, 2002 now U.S. Pat. No. 6,716,281, 6 Apr. 2004, entitled COMPOSITION AND METHOD FOR PREPARING CHEMICALLY-RESISTANT ROUGHENED COPPER SURFACES FOR BONDING TO SUBSTRATES. The '389 patent application is incorporated herein by reference in its entirety.

FIELD OF THE INVENTION

The present invention relates to preparing copper surfaces for bonding to substrates used in the manufacture of printed circuit boards (PCB's). More particularly, the invention relates to the manufacture of multilayer PCB's.

BACKGROUND OF THE INVENTION

Multilayer PCB's are constructed by interleaving imaged conductive layers of copper with dielectric layers to make a multilayer sandwich. The dielectric layers are organic resin layers that bond the copper layers together. Typically, the layers of copper and dielectric are bonded together by the application of heat and pressure. The surface of the copper is smooth, however, and does not bond easily to the dielectric layer.

Improved bonding can be achieved by etching or otherwise roughening the surface of the copper to provide microscopic crevices and ridges in the surface of the copper. For example, mechanical means may be used to roughen the copper surface. Unfortunately, delicate circuit patterns are susceptible to damage if mechanically roughened. Thus, there is a need for a copper surface roughening process that does not require mechanical roughening of the copper surface.

Oxide processes are also known in which an oxide having a rough surface is formed on the copper surface. The oxide may be formed by chemical treatment of the copper. One such oxide process is described in U.S. Pat. No. 4,512,818, which provides a treatment solution for the formation of black oxide layers on copper surfaces of multi-layered printed circuits. The treatment solution comprises an oxidant and a hydroxide and is characterized by the addition of a water soluble or dispersible polymer to regulate the properties of the black oxide solution.

Another oxide process is described in U.S. Pat. No. 5,861,076. The '076 patent describes a bond enhancement process for promoting strong, stable adhesive bonds between surfaces of copper foil and adjacent resin impregnated substrates or superimposed metallic sublayers. According to the process of the invention, a black oxide-coated copper surface is treated with an aqueous reducing solution containing sodium metabisulfite and sodium sulfide to convert the black oxide coating to a roughened metallic copper coating. The roughened metallic copper-coated surface is then passivated and laminated to a resin impregnated substrate.

U.S. Pat. No. 5,492,595 also pertains to an oxide roughening process. The '595 patent describes a method for treating an oxidized surface of a copper film for bonding to a resinous layer. According to the method of the invention, an oxidized surface of a copper film having cupric oxide whiskers protruding therefrom is contacted with an acidic reducing solution containing thiosulfate to produce a reduced copper surface. The reduced copper surface is then rinsed with an acidic solution, and preferably treated with a passivating agent to minimize any reoxidation prior to laminate formation. A preferred passivating agent is 2-mercaptobenzothiazole.

Oxide processes, while well known, have many shortcomings. A typical oxide process is run at such high temperatures that the substrate is often distorted, leading to quality control problems and additional production costs. The oxidation process is also associated with uniformity problems in which portions of the copper surface are not oxidized or coated by the oxidizing solution. Uniformity problems lead to partial delamination in the multilayer PCB's. To avoid this problem the PCB is often run through multiple passes to obtain a more uniform oxide coating. Performing multiple passes adds considerably to production cost. Thus, there is a need for a copper roughening process that does not require multiple passes or high temperature, and that does not suffer from the uniformity problems of conventional oxide processes.

Another shortcoming of the typical chemical oxide modification process is that a strong reducing agent, such as dimethylamine borane, is applied to the oxide coating to obtain an even oxide coating. This type of adhesion promotion process produces an oxide coating that is fragile and prone to scratching during handling. Inspection of the circuitry prior to lamination is difficult because of the fragility of the oxide coating. Therefore, there is a need for an adhesion promotion process that permits a less problematic inspection after the adhesion promotion process and prior to the lamination step.

In response to the various problems associated with traditional oxide processes, and in particular their time consuming nature and high processing temperatures, alternative oxide coating processes have been developed. These alternative processes combine the oxidation function of the traditional processes with a controlled etch that actually roughens the underlying copper surface while oxidizing it at the same time. These alternative oxide coating processes tend to be much faster than traditional oxide processes because they form bonds with increased strength and therefore do not require multiple passes. In addition, the alternative methods do not require high temperature processing.

One alternative oxide coating process is described in U.S. Pat. No. 5,800,859. The process includes a treating step in which a metal surface is contacted with an adhesion promotion material. The adhesion promotion material includes 0.1 to 20% by weight hydrogen peroxide, an inorganic acid, an organic corrosion inhibitor and a surfactant. The surfactant is preferably a cationic surfactant, usually an amine surfactant and most preferably a quaternary ammonium surfactant.

Another alternative oxide coating process is described in U.S. patent application Ser. No. 09/479,089, which is incorporated herein by reference in its entirety. The '089 application describes a method and composition for providing roughened copper surfaces suitable for subsequent multilayer lamination. The method involves contacting a smooth copper surface with an adhesion promoting composition which includes an oxidizer, a pH adjuster, a topography modifier, and either a coating promoter or a uniformity enhancer.

While alternative oxide processes such as that described the '089 application are advantageous over conventional oxide coating processes for a variety of reasons, the roughened copper surfaces formed by such processes exhibit chemical sensitivity and thus tend to be susceptible to chemical attack. Chemical attack typically occurs during post lamination processing steps. After a multilayer copper and dielectric sandwich is formed through the lamination process, certain post lamination processing steps are performed to prepare the multilayer PCB.

For example, "through-holes" are drilled through the multilayer sandwich in order to connect the inner layers of the circuit board. The act of drilling these holes typically leaves traces of resin smear on the through-hole interconnections that must be removed by a desmear process. One desmear process involves the application of a solvent sweller and a permanganate etch which can chemically attack the bond between the copper surface and dielectric resin at the site of the through holes. The permanganate etch is typically followed by an acid neutralizer which can also chemically attack the bond and cause delamination. While other through-hole cleaning techniques are known, such as plasma etch or laser ablation, these processes generate intense heat which can also attack the copper/resin interface.

Once the desmear process is completed, the drilled holes are made conductive through direct metalization or similar processes. These processes involve numerous alkaline and acid processing steps, all of which can chemically attack the copper/resin interface. Further, the conductive through-hole is usually sealed with a layer of electrolytic copper. The electrolytic process involves alkaline and acidic baths which can also lead to chemical attack of the through-hole interconnects. The result of these chemical attacks is the delamination of the sandwich layers in the area of the through holes.

The chemically attacked area is termed "pink ring" or "wedge void" in the circuit board industry. The formation of pink rings or wedge voids represents serious defects in the PCB's, especially in an era when increasingly high quality and reliability are demanded in the PCB industry. Thus, there is a need for an improved alternative oxide coating process that provides a surface that is less susceptible to chemical attack during post-lamination processing steps.

BRIEF SUMMARY OF THE INVENTION

Accordingly, an object of this invention is to provide a copper surface roughening process that does not require mechanical roughening of the copper surface.

Another object is to provide a copper surface roughening process that does not suffer from the uniformity problems of conventional oxide processes.

A further object is to provide a copper surface roughening process that does not require multiple passes or high temperature.

Yet another object is to provide a copper surface roughening process that provides a surface that is less susceptible to chemical attack during post-lamination processing steps.

A further object is to provide an improved alternative oxide coating process and composition that provides a surface that is less susceptible to chemical attack during post-lamination processing steps than at least some other alternative oxide coating processes and compositions.

A yet further object is to provide a copper surface roughening process that provides a surface that is more acid resistant during post-lamination processing steps.

Another object is to provide an improved alternative oxide coating process and composition that provides a surface that is more acid resistant during post-lamination processing steps than at least some other alternative oxide coating processes and compositions.

At least one of these objects is addressed, in whole or in part, by the present invention. In one embodiment, the invention is a composition and method for roughening a copper surface in order to provide higher bond strengths between the copper and dielectric resin layers in a multilayer PCB, where such bonds are also resistant to chemical attack. The composition comprises an oxidizer, a pH adjuster, a topography modifier, and a coating stabilizer. In another embodiment, the invention is a process for preparing roughened copper surfaces suitable for subsequent multilayer lamination. The process involves contacting a copper surface with an adhesion promoting composition under conditions effective to provide a roughened copper surface, and then contacting the roughened copper surface with an acid resistance promoting composition.

DETAILED DESCRIPTION OF THE INVENTION

While the invention will be described in connection with several embodiments, it will be understood that the invention is not limited to those embodiments. On the contrary, the invention includes all alternatives, modifications, and equivalents as may be included within the spirit and scope of the appended claims.

As noted above, one aspect of the present invention is an adhesion promoting composition which provides a roughened copper surface, comprising an oxidizer, a pH adjuster, a topography modifier, and a coating stabilizer.

Any suitable oxidizer known in the art may be used in the inventive composition. Suitable oxidizers include hydrogen peroxide. The oxidizer may be present in the range between about 0.05 wt % and about 5 wt %, alternatively in the range between about 0.1 wt % and about 4 wt %. As yet another alternative, the oxidizer may be present in the range between about 0.5 wt % and about 3 wt %, alternatively in the range between about 0.5 wt % and about 2 wt %. Proportions of oxidizer in this specification are based on undiluted quantities, although it will be recognized that, in practice, the oxidizers are typically part of an aqueous solution when added to the composition.

If hydrogen peroxide is used as the oxidizer, a hydrogen peroxide stabilizer may be used (although the use of a stabilizer is not required to practice this invention). Non-limiting examples of optional hydrogen peroxide stabilizers include: alkyl monoamines having 2 to 10 carbon atoms, and their salts; polymethylenediamines having 4 to 12 carbon atoms and their salts; alkoxyamines formed by substituting at least one hydrogen atom of ammonia by an alkoxy radical having 2 to 6 carbon atoms and alkoxyamines formed by substituting at least one hydrogen atom connected with the nitrogen atom of an alkyl monoamine having 2 to 10 carbon atoms by an alkoxy radical having 2 to 6 carbon atoms; alkyl acyl radical formed by substituting at least one hydrogen atom of ammonia by an alkyl acyl radical having 3 to 6 carbon atoms, and at least one alkyl acid amide formed by substituting at least one alkyl monoamine having 2 to 10 carbon atoms by an alkyl acyl radical having 3 to 6 carbon atoms; alicyclic imines having a 5 to 8 membered ring; mono-n-propylamine, di-n-propylamine, tri-n-propylamine and hexamethylenediamine; octylamine; and propionylamide. In addition, U.S. Pat. Nos. 3,756,957, and 5,800,859 describe a range of suitable hydrogen peroxide stabilizers; U.S. Pat. Nos. 3,756,957 and 5,800,859 are hereby incorporated by reference in their entirety. An example of a suitable hydrogen peroxide stabilizer from the categories in these patents is sodium phenolsulfonate.

If a hydrogen peroxide stabilizer is used, it may be present in the composition in an amount of from about 0.001 wt % to about 5 wt %, alternatively in an amount of from about 0.005 wt % to about 1 wt %. Alternatively, the hydrogen peroxide stabilizer may be present in the composition in an amount effective to achieve the purpose of stabilizing the hydrogen peroxide to the desired degree.

The choice of pH adjuster is not critical. Any suitable organic or inorganic acid may be used, although nitric acid is not preferred. Non-limiting examples of suitable acids include sulfuric, phosphoric, acetic, formic, sulfamic, hydroxy-acetic acid, and mixtures thereof. Alternatively, sulfuric acid may be selected as the pH adjuster. The pH adjuster may be present in the composition in the range between about 0.01% and about 20% by weight and alternatively in the range between about 0.5% and about 10% by weight.

Suitable topography modifiers are five membered aromatic fused N-heterocyclic ring compounds (hereinafter "N-heterocyclic compounds") with at least one nitrogen atom in the N-heterocyclic ring:

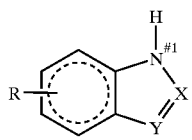

In the above formula, X may be N or C, and Y may be N or C. The R substituents on the aromatic ring may be H, halogen, hydroxy, alkyl, hydroxyalkyl, amino, aminoalkyl, nitro, nitroalkyl, mercapto, mercaptoalkyl, or alkoxy groups containing from 1 to about 10 or more carbon atoms. Specific examples of alkyl groups include methyl, ethyl, propyl, isopropyl, n-butyl, sec-butyl, tert-butyl, amyl, etc. At least one of the nitrogen atoms in the heterocyclic ring depicted above is bonded directly to a hydrogen atom. The nitrogen atom at the #1 position in the heterocyclic ring is preferably, but not necessarily, bonded to a hydrogen atom. Non-limiting examples of suitable topography modifiers include 1H-benzotriazole (CAS registration number, "CAS": 95-14-7), 1H-indole (CAS 120-72-9), 1H-indazole (CAS 271-44-3), and 1H-benzimidazole (CAS 51-17-2). Derivatives of N-heterocyclic compounds suitable as topography modifiers include N-heterocyclic compounds with a hydrogen atom bonded to the nitrogen atom at the #1 position in the heterocyclic ring.

Non-limiting examples of suitable derivatives of 1H-benzotriazole (CAS 95-14-7) suitable for use as topography modifiers include: 5-methyl-1H-benzotriazole (CAS 136-85-6), 6-Nitro-1H-benzotriazole (CAS 2338-12-7), 1H-naphtho(1,2-d)triazole (CAS 233-59-0), and 1H-Naphtho[2,3-d]triazole (CAS 269-12-5).

Non-limiting examples of suitable derivatives of indole (1H-Indole; CAS 120-72-9) suitable for use as topography modifiers include: 5-Aminoindole (1H-Indol-5-amine; CAS 5192-03-0), 6-methylindole (1H-Indole, 6-methyl-; CAS 3420-02-8), 1H-indole-5-methyl (CAS 614-96-0), 7-methylindol (1H-Indole, 7-methyl-; CAS 933-67-5), 3-methylindole (1H-Indole, 3-methyl-; CAS 83-34-1), 2-Methylindole (2-Methyl-1H-indole; CAS 95-20-5), 1H-Indole, 3,5-dimethyl-(CAS 3189-12-6), 2,3-Dimethylindole (1H-Indole, 2,3-dimethyl-; CAS 91-55-4), and 2,6-dimethylindole (1H-Indole, 2,6-dimethyl-; CAS 5649-36-5).

Non-limiting examples of suitable derivatives of 1H-indazole (CAS 271-44-3) suitable for use as topography modifiers include: 1H-Indazol-5-amine (CAS 19335-11-6) and 3-Chloro-1H-indazole (CAS 29110-74-5).

Non-limiting examples of suitable derivatives of 1H-benzimidazole (CAS 51-17-2) suitable for use as topography modifiers include: 2-Hydroxy-1H-benzimidazole (CAS 615-16-7), 2-Methyl-1H-benzimidazole (CAS 615-15-6), and 2-(methylthio)-1H-Benzimidazole (CAS 7152-24-1).

The topography modifier may be present in the range between about 0.1 g/l (grams per liter) and about 20 g/l, alternatively in the range between about 0.5 g/l and about 7 g/l. For example, 1H-benzotriazole can be present in the range between about 0.1 g/l and about 20 g/l, alternatively in the range between about 0.5 g/l and about 7 g/l.

The topography modifier is thought to vary the surface characteristics of the copper during treatment of the copper surface with the adhesion promoting solution of the invention. During treatment with the adhesion promoting composition of the invention, the copper surface is believed to comprise a complex of copper together with the topography modifier to produce a greater surface area than would be possible without the topography modifier. As a result, the topography modifier has a beneficial effect on peel strength—indeed, peel strength is dramatically reduced if the topography modifier is not used in the adhesion promoting solution. The inventors do not intend the foregoing theory to limit the invention to processes or products that operate as specified by this theory. Any inaccuracy in this theory does not limit the scope of the present invention.

The coating stabilizer is a sulfur compound that renders the roughened copper surface more chemically resistant to subsequent chemical processing. A suitable coating stabilizer may have the following formula:

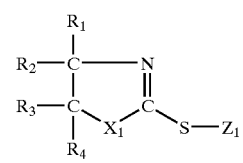

wherein $Z_1$ is H, Li, Na, K, $NH_4$,

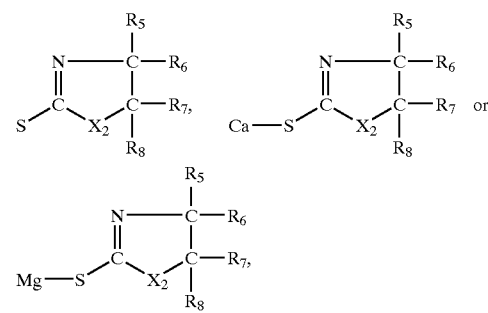

wherein $X_1$ is S or N—$R_9$, and wherein $X_2$ is S or N—$R_{10}$. The R groups are independently selected from H, halogen, S, epoxide, glycol, hydroxy, aryloxy, benzyloxy, alkoxy, haloalkoxy, amino, monoalkylamino, dialkylamino, heteroalkylamino, acyloxy, acyl, ketone, quinone, aldehyde, carbohydrate, organometallic, a $C_1$ up to $C_{18}$ alkyl which is linear or branched and may be singly or multiply substituted in singular or multiply bonded fashion, a cycloalkyl which may be singly or multiply substituted in singular or multiply bonded fashion, a heterocyclic which may be singly or multiply substituted in singular or multiply bonded fashion, a $C_1$ up to $C_{18}$ alkenyl which is linear or branched and may be singly or multiply substituted in singular or multiply bonded fashion, a $C_1$ up to $C_{18}$ alkadienyl which is linear or branched and may be singly or multiply substituted in singular or multiply bonded fashion, a $C_1$ up to $C_{18}$ alkynyl which is linear or branched and may be singly or multiply substituted in singular or multiply bonded fashion, an aryl which may be singly or multiply substituted in singular or multiply bonded fashion, a heteroaryl which may be singly or multiply substituted in singular or multiply bonded fashion, an alkylaryl which may be singly or multiply substituted in singular or multiply bonded fashion, an arylalkyl which may be singly or multiply substituted in singular or multiply bonded fashion, and combinations thereof, wherein the substituents are selected from the group consisting of halogen, epoxide, glycol, N, O, S, haloalkyl, hydroxy, aryloxy, benzyloxy, alkoxy, haloalkoxy, amino, monoalkylamino, dialkylamino, heteroalkylamino, acyloxy, acyl, ketone, quinone, aldehyde, carbohydrate, organometallic, alkyl, aryl, and combinations thereof. In addition, any two or more of $R_{1-10}$ may form a linkage or linkages comprising any of the groups identified above suitable for forming such linkages. Depending on the linkage, some of $R_{1-10}$ may drop out. For example, if $R_2$ and $R_3$ form an aromatic linkage such as a benzene ring, then $R_1$ and $R_4$ will be nothing. The same holds true for the remainder of $R_{1-8}$: one substituent of each pair $R_1$ and $R_2$, $R_3$ and $R_4$, $R_5$ and $R_6$, and $R_7$ and $R_8$ will be nothing if the other substituent in the pair is part of an aromatic linkage.

Suitable coating stabilizers falling within formula (I) include the following: 2-mercapto benzothiazole; 2,2'-dithiobis(benzothiazole); 6-ethoxy-2-mercaptobenzothiazole; 2-mercaptothiazoline; and 3,4,5,6-tetrahydro-2-pyrimidinethiol. Alternatively, 2-mercaptothiazoline may be used as the coating stabilizer.

The coating stabilizer may, in the alternative, have the following formula:

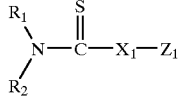
(II)

wherein $Z_1$ is Li, Na, K, $NH_4$, $R_3$,

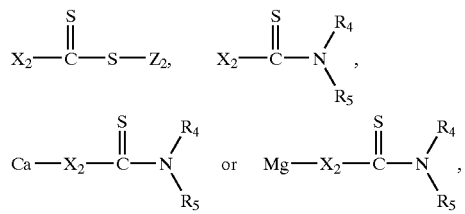

wherein $Z_2$ is Li, Na, K or $NH_4$, wherein $X_1$ is S or $N-R_6$, and wherein $X_2$ is S or $N-R_7$. The R groups are independently selected from H, halogen, S, epoxide, glycol, hydroxy, aryloxy, benzyloxy, alkoxy, haloalkoxy, amino, monoalkylamino, dialkylamino, heteroalkylamino, acyloxy, acyl, ketone, quinone, aldehyde, carbohydrate, organometallic, a $C_1$ up to $C_{18}$ alkyl which is linear or branched and may be singly or multiply substituted in singular or multiply bonded fashion, a cycloalkyl which may be singly or multiply substituted in singular or multiply bonded fashion, a heterocyclic which may be singly or multiply substituted in singular or multiply bonded fashion, a $C_1$ up to $C_{18}$ alkenyl which is linear or branched and may be singly or multiply substituted in singular or multiply bonded fashion, a $C_1$ up to $C_{18}$ alkadienyl which is linear or branched and may be singly or multiply substituted in singular or multiply bonded fashion, a $C_1$ up to $C_{18}$ alkynyl which is linear or branched and may be singly or multiply substituted in singular or multiply bonded fashion, an aryl which may be singly or multiply substituted in singular or multiply bonded fashion, a heteroaryl which may be singly or multiply substituted in singular or multiply bonded fashion, an alkylaryl which may be singly or multiply substituted in singular or multiply bonded fashion, an arylalkyl which may be singly or multiply substituted in singular or multiply bonded fashion, and combinations thereof, wherein the substituents are selected from halogen, epoxide, glycol, N, O, S, haloalkyl, hydroxy, aryloxy, benzyloxy, alkoxy, haloalkoxy, amino, monoalkylamino, dialkylamino, heteroalkylamino, acyloxy, acyl, ketone, quinone, aldehyde, carbohydrate, organometallic, alkyl, aryl, and combinations thereof. In addition, any two or more of $R_{1-7}$ may form a linkage or linkages comprising any of the groups identified above suitable for forming such linkages.

Suitable coating stabilizers falling within formula (II) include the following: 2-imidazolidinethione; potassium 3-(thiocarbamoyl)-dithiocarbazate; sodium diethyldithiocarbamate; sodium dimethyldithiocarbamate; tetraethylthiuram disulfide; tetramethylthiuram disulfide; and 2,5-dithiobiurea. Alternatively, sodium diethyldithiocarbamate may be used as the coating stabilizer.

The coating stabilizer may be present in the composition in the range between about 1 to about 1000 ppm, alternatively in the range between about 2 to about 200 ppm, alternatively in the range between about 50 to about 150 ppm, alternatively about 100 ppm. For example, 2-mercaptothiazoline can be present at about 100 ppm.

The inventive composition for roughening a copper surface may also optionally include a uniformity enhancer and/or a coating promoter. The optional uniformity enhancer may be a tetrazole such as 1H-tetrazole (CAS 288-94-8) and its derivatives:

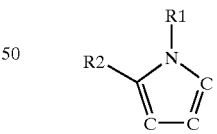

The R1 and R2 substituents on the tetrazole ring may be hydroxyl, amino, alkyl, hydroxyalkyl, aminoalkyl, nitroalkyl, mercaptoalkyl, or alkoxy groups containing from 1 to about 10 or more carbon atoms. Specific examples of alkyl groups include methyl, ethyl, propyl, isopropyl, n-butyl, sec-butyl, tert-butyl, amyl, etc. Non-limiting examples of suitable tetrazole derivatives that can be used in the present invention as a uniformity enhancer include: 5-aminotetrazole (CAS 5378-49-4), 5-methyltetrazole (CAS 4076-36-2), 5-methylaminotetrazole (CAS 53010-03-0), 1H-tetrazol-5-amine (CAS 4418-61-5), 1H-tetrazol-5-amine, N,N-dimethyl-(CAS 5422-45-7), 1-methyltetrazole (CAS 16681-77-9), 1-methyl-5-mercaptotetrazol 1,5- dimethyltetrazole (CAS 5144-11-6), 1-methyl-5-aminotetrazole (CAS 5422-44-6), and 1-methyl-5-methylamino-tetrazole (CAS 17267-51-5).

The optional uniformity enhancer may be present in an amount effective to enhance the uniformity of the roughened copper surface. Alternatively, the uniformity enhancer may be present in the range between about 0.01 to about 10 g/l, alternatively in the range between about 0.1 to about 5 g/l, alternatively in the range between about 0.3 to about 1 g/l, alternatively at about 0.5 g/l. For example, 5-aminotetrazole can be present at about 0.5 g/l.

The optional coating promoter is a five membered aromatic fused N-heterocyclic ring compound with 1 to 3 nitrogen atoms in the fused ring, wherein none of the 1 to 3 nitrogen atoms in the fused ring are bonded to a hydrogen atom:

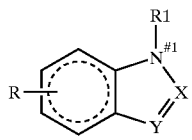

In the above formula, X may be N or C, and Y may be N or C. The R substituents on the aromatic ring may be H, halogen, hydroxy, alkyl, hydroxyalkyl, amino, aminoalkyl, nitro, nitroalkyl, mercapto, mercaptoalkyl, or alkoxy groups containing from 1 to about 10 or more carbon atoms. The R1 substituents on the heterocyclic ring bonded to the nitrogen atom at the #1 position may be hydroxyl, amino, alkyl, hydroxyalkyl, aminoalkyl, nitroalkyl, mercaptoalkyl, or alkoxy groups. Specific examples of alkyl groups include methyl, ethyl, propyl, isopropyl, n-butyl, sec-butyl, tert-butyl, amyl, etc. Non-limiting examples of optional coating promoters suitable for use in the present invention include: 1-hydroxybenzotriazole (CAS 2592-95-2), 1-methylindole (CAS 603-76-9), 1-methylbenzotriazole (CAS 13351-73-0), 1-methylbenzimidazole (CAS 1632-83-3), 1-methylindazole (CAS 13436-48-1), 1-ethyl-indazole (CAS 43120-22-5), 1H-Indole, 1,5-dimethyl-indole (CAS 27816-53-1), 1,3-dimethyl-indole (CAS 875-30-9), methyl 1-(butylcarbamoyl)-2-benzimidazolecarbonate, 1-(chloromethyl)-1H-benzotriazole, and 1-aminobenzotriazole.

The optional coating promoting may be present in an amount effective to enhance the coating characteristics of the composition. Alternatively, the coating promoter may be present in the range between about 0.01 to about 10 g/l, alternatively in the range between about 0.1 to about 5 g/l, alternatively in the range between about 0.3 to about 3 g/l, alternatively at about 2 g/l. For example, 1-hydroxybenzotriazole can be present at about 2 g/l.

The formulation of the inventive composition for roughening a copper surface may be made up with de-ionized water.

The inventive composition for roughening a copper surface does not require halogen ions and can be free of halogen ions, if desired. The inventors define "halogen ions" as fluoride, chloride, bromide or iodide ions or any combination or equivalent of these ions in aqueous solution. In addition, the composition of the present invention does not require a surfactant to achieve an excellent roughened copper surface.

Halogens can, however, be employed in the formulation if desired. For example, a small amount of chloride ion or other halide ions can be used in the formulation. If employed, halide ions may be present in the range between about 0.1 ppm to about 1000 ppm, alternatively in the range between about 1 ppm to about 100 ppm.

The adhesion promoting composition may optionally comprise a copper salt such as copper sulfate. The aqueous copper ions protect virgin stainless steel surfaces, such as those of a process tank, from chemical attack. Hence it is advantageous to include a quantity of copper salt in the adhesion promoting composition if the copper surface to be treated is dipped into a new or previously unused steel tank. However, there is no requirement to include a copper salt to obtain a highly satisfactory roughened copper surface.

The adhesion promoting composition may also optionally contain a water soluble polymer. Any water soluble polymer known in the art may be used in the present adhesion promoting composition. Suitable water soluble polymers include polymers of ethylene oxide and propylene oxide, polyethylene glycols, polypropylene glycols, and polyvinyl alcohols. The water soluble polymer may be present in the range of between about 0.01 wt % and about 5 wt %, alternatively in the range of between about 0.05 wt % and about 3 wt %, alternatively in the range of between about 0.1 wt % and about 1 wt %, alternatively at about 0.5 wt %. Polyethylene glycol may be selected as the optional water soluble polymer. One suitable source of polyethylene glycol is the product Pluracol® E2000 sold by the BASF Corporation.

A copper surface can be treated with the adhesion promoting composition in a variety of ways, including (but not limited to) immersion in a bath, dipping in a bath, or spraying. The treatment may take place at any temperature and for any duration suitable to obtain the desired uniformed roughened copper surface. For example, suitable roughened copper surfaces may be obtained where the temperature during treatment is in the range from about 40° F. to about 180° F. (about 4° C. to about 82° C.), alternatively from about 70° F. to about 150° F. (about 21° C. to about 66° C.), alternatively from about 80° F. to about 120° F. (about 27° C. to about 49° C.), alternatively about 100° F. (about 38° C.). Suitable roughened copper surfaces may also be obtained with temperatures outside of these ranges, however. With respect to duration, the adhesion promoting composition may, for example, be contacted with the copper surface for about 1 second to about 1 hour, alternatively from about 10 seconds to about 10 minutes, alternatively from about 30 seconds to about 5 minutes, alternatively for about 1 minute. Suitable roughened copper surfaces may also be obtained with contact durations outside of these ranges, however.

In keeping with another aspect of the present invention, the process of preparing roughened copper surfaces suitable for subsequent multilayer lamination includes the following steps, some of which are optional:

(i) Providing a substantially clean copper surface, optionally by applying a highly built alkaline cleaning solution to a copper surface. The highly built alkaline cleaning solution comprises a surfactant and a phosphate or a phosphate ester.

(ii) Optionally dipping the substantially clean copper surface into a pre-dip to condition the surface and/or to remove surplus cleaning solution from the copper surface providing a clean copper surface. One suitable optional pre-dip may comprise an oxidizer, a pH adjuster and a topography modifier, as those components are described above. The oxidizer and topography modifier may be in the pre-dip in the ranges described above. The pH adjuster may be in the pre-dip in the range between about 0.005% and about 10% by weight and alternatively in the range between about 0.01% and about 5% by weight. A hydrogen peroxide stabilizer may be used if hydrogen peroxide is used as the oxidizer. The hydrogen peroxide stabilizer may be selected from the various stabilizers described above and may be in the pre-dip in the ranges described above. Other suitable pre-dips that will be known to those of skill in the art may also be used. The pre-dip treatment may take place at any temperature and for any duration suitable to obtain the desired conditioning and/or cleaning, including the temperatures and durations discussed above for application of the adhesion promoting composition.

(iii) Applying to the clean copper surface an adhesion promoting composition comprising an oxidizer, a pH adjuster, a topography modifier, a coating stabilizer, and optionally, other optional components as described above.

(iv) Optionally dipping the uniformly roughened copper surface into a post-dip to provide a roughened copper surface suitable for subsequent multilayer lamination. The optional post-dip is used to coat the roughened copper surface with a coating of organic molecules to enable enhanced bonding between the roughened copper surface and a suitable dielectric resin. The post-dip solution comprises an azole or silane compound. The post-dip may further comprise a titanate, zirconate, or aluminate.

Step (i) may further include draining excess cleaning solution from the copper surface.

Non-limiting examples of silanes for enhancing the bond strength between the copper surface and the dielectric include any trichloro or trimethoxy silane, especially those derivatives with at least one nitrogen atom such as trimethoxysilylpropyldiethylenetriamine. Other examples of silanes suitable for use in the present invention include:

3-methylacryloyloxypropyltrimethoxysilane, 3-(N-styrylmethyl-2aminoethylamino) propyltrimethoxysilane hydrochloride, 3-(N-allyl-2-aminoethylamino)-propyltrimethoxysilane hydrochloride, N-(styrylmethyl)-3-aminopropyltrimethoxysilane hydrochloride, N-2-aminoethyl-3-aminopropyltrimethoxysilane, 3-(N-Benzyl-2-aminoethylamino)-propyltrimethoxy silane hydrochloride, beta-(3,4-epoxycyclohexyl) ethyltrimethoxysilane, gamma-aminopropyl-triethoxy silane, gamma-glycidoxypropyltrimethoxysilane, and vinyltrimethoxysilane.

Non-limiting examples of titanates that can be used in the present invention include:

titanate amine, tetraocytl di(ditridecyl)phosphito titanate, tetra(2,2-diallyloxymethyl) butyl-di(ditridecyl)phosphito titanate, neopentyl(diallyl)oxytri(diocytl)pryo-phosphato titante, and neopentyl(diallyl)oxy tri(m-amino)phenyl titanate.

Non-limiting examples of suitable zirconates (available, for example, from Kenrich Petrochemicals, Inc., Bayonne, N.J.) include:

KZ 55-tetra (2,2 diallyloxymethyl)butyl, di(ditridecyl)phosphito zirconate,

NZ-01-neopentyl(diallyl)oxy, trineodecanoyl zirconate, and

NZ-09-neopentyl(diallyl)oxy, tri(dodecyl)benzenesulfonyl zirconate.

Further non-limiting examples of suitable zirconates include: tetra (2,2 diallyloxymethyl)butyl-di(ditridecyl) phosphito zirconate, and zirconium IV 2,2-dimethyl 1,3-propanediol.

Non-limiting examples of aluminates that can be used in the present invention include: Kenrich® diisobutyl(oleyl) acetoacetylaluminate (KA 301), and diisopropyl(oleyl) acetoacetyl aluminate (KA 322).

The inventors have found that the use of a coating stabilizer in the inventive adhesion promoting composition, as described above, renders the coating on the copper surface more chemically resistant to subsequent processing than alternative oxide coating processes known in the art which do not use such stabilizer. Another aspect of the present invention is a process in which a copper surface is treated with an adhesion promoting composition in which a coating stabilizer is optional, and then subsequently contacted with a composition that promotes acid resistance. In other words, the roughened copper surface is made resistant to chemical attack by a separate application of an acid resistance promoting composition after the adhesion promoting composition has been applied.

The inventors discovered that this two-step approach is particularly advantageous from a manufacturing standpoint. In particular, it was discovered that some of the coating stabilizers described above are themselves susceptible to chemical attack. When such coating stabilizers are added directly to an adhesion promoting bath which contains a pH adjuster, such as sulfuric acid, they tend to decompose over time into their synthetic components. After such decomposition, the baths no longer produce an acid resistant coating on the copper surface. Typically, decomposition of the coating stabilizer occurs within 30 minutes to 4 hours of addition. The cost associated with continually refreshing the baths to avoid the effects of this decomposition render this process less desirable for commercial manufacturing purposes.

The inventive process which avoids these decomposition issues comprises the steps of (1) contacting with a clean copper surface an adhesion promoting composition under conditions effective to provide a roughened copper surface, and (2) contacting the roughened copper surface with an acid resistance promoting composition.

The adhesion promoting composition is the same as that described above, with the exception that the coating stabilizer is an optional component, and is preferably absent. Thus, the adhesion promoting composition comprises an oxidizer, a pH adjuster, a topography modifier, and, optionally, a coating stabilizer as well as any of the other optional components described above. The adhesion promoting composition may be applied to the copper surface in any of the various manners and under any of the various conditions described above.

Suitable acid resistance promoting compositions include thio compounds, particularly thiocarbamates, thiocarbonates, xanthates, and sulfides. Alternatively, the acid resistance promoting composition is a sulfur-containing compound which may have the following formula:

  (III)

wherein A is 1–20 (alternatively A may be 1–10 or 1–5) and $X_1$ is Mg, Ca, $Li_2$, $Na_2$, $K_2$, or $(NH_4)_2$. As yet another alternative, the acid resistance promoting composition may have the following formula:

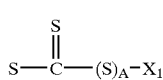

(IV)

wherein A is 1–20 (alternatively A may be 1–10 or 1–5) and $X_1$ is Mg, Ca, $Li_2$, $Na_2$, $K_2$, or $(NH_4)_2$.

As yet another alternative, the acid resistance promoting composition may have the following formula:

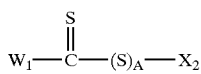

(V)

wherein $W_1$ is

$O-R_3$, or $S-R_3$, wherein A is 1–20, wherein $X_2$ is Li, Na, K, $NH_4$,

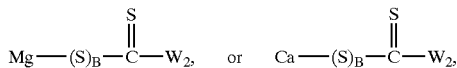

wherein $W_2$ is

$O-R_6$, or $S-R_6$, and wherein B is 1–20. A may also be 1–10 or 1–5.

The R groups are independently selected from H, halogen, S, epoxide, glycol, hydroxy, aryloxy, benzyloxy, alkoxy, haloalkoxy, amino, monoalkylamino, dialkylamino, heteroalkylamino, acyloxy, acyl, ketone, quinone, aldehyde, carbohydrate, organometallic, a $C_1$ up to $C_{18}$ alkyl which is linear or branched and may be singly or multiply substituted in singular or multiply bonded fashion, a cycloalkyl which may be singly or multiply substituted in singular or multiply bonded fashion, a heterocyclic which may be singly or multiply substituted in singular or multiply bonded fashion, a $C_1$ up to $C_{18}$ alkenyl which is linear or branched and may be singly or multiply substituted in singular or multiply bonded fashion, a $C_1$ up to $C_{18}$ alkadienyl which is linear or branched and may be singly or multiply substituted in singular or multiply bonded fashion, a $C_1$ up to $C_{18}$ alkynyl which is linear or branched and may be singly or multiply substituted in singular or multiply bonded fashion, an aryl which may be singly or multiply substituted in singular or multiply bonded fashion, a heteroaryl which may be singly or multiply substituted in singular or multiply bonded fashion, an alkylaryl which may be singly or multiply substituted in singular or multiply bonded fashion, an arylalkyl which may be singly or multiply substituted in singular or multiply bonded fashion, and combinations thereof, wherein the substituents are selected from the group consisting of halogen, epoxide, glycol, N, O, S, haloalkyl, hydroxy, aryloxy, benzyloxy, alkoxy, haloalkoxy, amino, monoalkylamino, dialkylamino, heteroalkylamino, acyloxy, acyl, ketone, quinone, aldehyde, carbohydrate, organometallic, alkyl, aryl, and combinations thereof. In addition, any two adjacent of $R_{1-6}$ may form a linkage or linkages comprising any of the groups identified above suitable for forming such linkages.

Suitable acid resistance promoting compositions falling with formulas (III), (IV) and (V) above include: sodium dialkyl dithio carbamates, sodium dialkyl polythiocarbamates, sodium dialkyl trithio carbonates, sodium dialkyl polythiocarbonates, sodium diaryl dithio carbamates, sodium diaryl polythiocarbamates, sodium diaryl trithio carbonates, sodium diaryl polythiocarbonates, sodium alkylaryl dithio carbamates, sodium alkylaryl polythiocarbamates, sodium alkylaryl trithio carbonates, sodium alkylaryl polythiocarbonates, potassium dialkyl dithio carbamates, potassium dialkyl polythiocarbamates, potassium dialkyl trithio carbonates, potassium dialkyl polythiocarbonates, potassium diaryl dithio carbamates, potassium diaryl polythiocarbamates, potassium diaryl trithio carbonates, potassium diaryl polythiocarbonates, potassium alkylaryl dithio carbamates, potassium alkylaryl polythiocarbamates, potassium alkylaryl trithio carbonates, potassium alkylaryl polythiocarbonates, ammonium dialkyl dithio carbamates, ammonium dialkyl polythiocarbamates, ammonium dialkyl trithio carbonates, ammonium dialkyl polythiocarbonates, ammonium diaryl dithio carbamates, ammonium diaryl polythiocarbamates, ammonium diaryl trithio carbonates, ammonium diaryl polythiocarbonates, ammonium alkylaryl dithio carbamates, ammonium alkylaryl polythiocarbamates, ammonium alkylaryl trithio carbonates, ammonium alkylaryl polythiocarbonates, dialkyl xanthates, diaryl xanthates, alkylaryl xanthates, sulfide, disulfide, trisulfide, tetrasulfide, polysulfide, and combinations thereof, wherein the alkyl component is a $C_1$ up to $C_{18}$ alkyl which is linear or branched and may be singly or multiply substituted in singular or multiply bonded fashion, wherein the aryl component is an aryl or a heteroaryl which may be singly or multiply substituted in singular or multiply bonded fashion, and wherein the substituents are selected from the group consisting of halogen, halide, epoxide, glycol, N, O, S, haloalkyl, hydroxy, aryloxy, benzyloxy, alkoxy, haloalkoxy, amino, monoalkylamino, dialkylamino, heteroalkylamino, acyloxy, acyl, ketone, quinone, aldehyde, carbohydrate, organometallic, alkyl, aryl, and combinations thereof. Several nonlimiting examples of suitable acid resistance promoting compositions are sodium dioctyldithiocarbamate, disodium trithiocarbonate, sodium sulfide, sodium N,N-dibutyldithiocarbamate, and sodium hydroquinone monomethyl ether xanthate ("HQMME-xanthate").

The acid resistance promoting composition may be contacted with the roughened copper surface in a variety of ways, including (but not limited to) immersion in a bath, dipping in a bath, or spraying. The acid resistance promoting composition may be contacted with the roughened copper surface as an aqueous solution. When applied in this fashion, the composition may be present in the aqueous solution between about 0.1 g/l and about 5 g/l. Alternatively, the composition may be present in the aqueous solution between about 1 g/l and about 3 g/l. As yet another alternative, the composition may be present in the aqueous solution at about 1 g/l.

The acid resistance promoting composition may be contacted with the roughened copper surface for at least about 1 second. Alternatively, the composition may be contacted with the roughened copper surface for between about 1 second to about 5 minutes. As yet another alternative, the composition may be contacted with the roughened copper surface for between about 5 seconds to about 2 minutes.

The acid resistance promoting composition may be contacted with the roughened copper surface at any temperature suitable to obtain the desired acid-resistant roughened copper surface. For example, suitable roughened copper surfaces may be obtained where the temperature during treatment is in the range from about 20° F. to about 180° F. (about −7° C. to about 82° C.), alternatively from about 40° F. to about 150° F. (about 4° C. to about 66° C.), alternatively from about 60° F. to about 120° F. (about 16° C. to about 49° C.), alternatively about 70° F. (about 21° C.), alternatively about room temperature. Suitable acid-resistant roughened copper surfaces may also be obtained with temperatures outside of these ranges, however.

The process of preparing roughened copper surfaces and subsequently post treating the surfaces with an acid resistance promoting composition may also include other optional steps. For instance, the process may comprise the following steps, some of which are optional:

(i) Providing a substantially clean copper surface, optionally by applying a highly built alkaline cleaning solution to a copper surface. The highly built alkaline cleaning solution comprises a surfactant and a phosphate or a phosphate ester.

(ii) Optionally dipping the substantially clean copper surface into a pre-dip to condition the surface and/or to remove surplus cleaning solution from the copper surface providing a clean copper surface. One suitable optional pre-dip may comprise an oxidizer, a pH adjuster and a topography modifier, as those components are described above. The oxidizer and topography modifier may be in the pre-dip in the ranges described above. The pH adjuster may be in the pre-dip in the range between about 0.005% and about 10% by weight and alternatively in the range between about 0.01% and about 5% by weight. A hydrogen peroxide stabilizer may be used if hydrogen peroxide is used as the oxidizer. The hydrogen peroxide stabilizer may be selected from the various stabilizers described above and may be in the pre-dip in the ranges described above. Other suitable pre-dips that will be known to those of skill in the art may also be used. The pre-dip treatment may take place at any temperature and for any duration suitable to obtain the desired conditioning and/or cleaning, including the temperatures and durations discussed above for application of the adhesion promoting composition.

(iii) Applying to the clean copper surface an adhesion promoting composition comprising an oxidizer, a pH adjuster, a topography modifier, optionally a coating stabilizer, and optionally, other optional components as described above, in order to form a roughened copper surface.

(iv) Optionally rinsing the roughened copper surface with water.

(v) Dipping the roughened copper surface in an aqueous solution containing an acid resistance promoting composition, as described above.

(vi) Optionally dipping the uniformly roughened copper surface into a post-dip to provide a roughened copper surface suitable for subsequent multilayer lamination. The optional post-dip is used to coat the roughened copper surface with a coating of organic molecules to enable enhanced bonding between the roughened copper surface and a suitable dielectric resin. The post-dip solution comprises an azole or silane compound. The post-dip may further comprise a titanate, zirconate, or aluminate.

Step (i) may further include draining excess cleaning solution from the copper surface.

The inventors have found that the use of an adhesion promoting composition on a copper surface, followed by subsequent treatment with an acid resistance promoting composition, renders the coating on the copper surface more chemically resistant to subsequent processing than other alternative oxide coating processes known in the art. At the same time, inefficiencies in the manufacturing process are avoided because the acid resistance promoting composition is applied in a separate step and thus is not subject to untimely decomposition due to the acidic nature of the adhesion promoting composition bath.

One practical test that can be used to indicate the better adhesion of resins to the present copper surface is a "peel strength" test. Self-adhesive tape is adhered to a treated copper surface which has been laminated to a polymeric substrate. The surface is placed into a nitric acid bath to remove the copper from the non-taped regions of the substrate. The tape is removed and the remaining copper is then mechanically peeled away from the substrate while measuring the force needed to accomplish the peel in pounds per inch. Higher peel strengths are typically indicative of a desirable, tightly-adhering coating.

One practical test that can be used to indicate the better resistance to chemical attack of the present copper surfaces is the simple application of an acid solution to the copper surfaces, followed by observation. Such test is described in further detail below in conjunction with the examples.

The following examples represent specific but nonlimiting embodiments of the present invention:

EXAMPLE 1

A clean copper surface was prepared by treating a substantially clean copper surface in a pre-dip bath at 70° F. (21° C.). The pre-dip bath comprised 1.15 wt % $H_2O_2$, 0.05 wt % sodium phenolsulfonate, 0.13 wt % $H_2SO_4$, 0.18 wt % benzotriazole (1.8 g/l), balance deionized water. The clean copper surface was removed from the pre-dip bath after one minute.

The clean copper surface was then treated in a bath comprising 1.42 wt % $H_2O_2$ (oxidizer), 0.06 wt % sodium phenolsulfonate ($H_2O_2$ stabilizer), 8.61 wt % $H_2SO_4$ (pH adjuster), 0.57 wt % benzotriazole ("BTA") (topography modifier), 0.0017 wt % NaCl (chloride ion), 0.38 wt % polyethylene glycol, balance deionized water (see Table 1). The bath temperature was maintained at 100° F. (38° C.). The copper surface was removed from the bath after one minute, rinsed with deionized water, and dried with an air hose. A roughened texture was observed on the copper surface, as is consistent with an alternative oxide coating process. Using an eye-dropper, a solution containing 15% by volume hydrochloric acid was applied to the roughened surface. The roughened surface immediately dissolved, revealing bare copper beneath.

EXAMPLE 2

A clean copper surface was treated in a bath comprising 1.42 wt % $H_2O_2$, 0.06 wt % sodium phenolsulfonate, 8.61 wt % $H_2SO_4$, 0.57 wt % BTA, 0.0017 wt % (17 ppm) NaCl, 0.38 wt % polyethylene glycol, 1 ppm sodium diethyldithiocarbamate ("SDDC") (a coating stabilizer), balance deionized water (see Table 1). The bath temperature was maintained at 100° F. (38° C.). The copper surface was removed from the bath after one minute, rinsed with deionized water, and dried with an air hose. A roughened texture was observed on the copper surface, as is consistent with an alternative oxide coating process. Using an eye-dropper, a solution containing 15% by volume hydrochloric acid was applied to the roughened surface. The roughened surface dissolved over the course of 10–20 seconds, revealing bare copper beneath. The fact that the surface did not dissolve immediately demonstrates that the roughened surface was more chemically resistant than the roughened surface of Example 1, which was not prepared with a coating stabilizer.

EXAMPLE 3

A roughened copper surface was prepared in the same manner as Example 2, with the exception that the bath contained 5 ppm SDDC (see Table 1). Upon applying a 15% hydrochloric acid solution, the roughened surface dissolved over the course of 20–30 seconds, revealing bare copper beneath. The increased time for the roughened surface to dissolve demonstrates the improved chemical resistance of the surface.

EXAMPLE 4

A roughened copper surface was prepared in the same manner as Example 2, with the exception that the bath contained 20 ppm SDDC (see Table 1). Upon applying a 15% hydrochloric acid solution, the roughened surface dissolved over the course of 50–70 seconds, revealing bare copper beneath. Again, the increased time for the roughened surface to dissolve demonstrates the improved chemical resistance of the surface.

EXAMPLE 5

A roughened copper surface was prepared in the same manner as Example 2, with the exception that the bath contained 100 ppm SDDC (see Table 1). A 15% hydrochloric acid solution was applied to the roughened surface. After three to five minutes, the roughened surface was intact and no bare copper was visible. This demonstrates exceptional acid resistance compared to the surface of Example 1, which was prepared without a coating stabilizer.

See Table 1 for a summary of examples 1 to 5.

EXAMPLES 6 THROUGH 11

Adhesion promoting compositions similar to those tested in Examples 1–5 were used to prepare roughened copper surfaces, which were then tested for peel strength. Specifically, for each of Examples 6–11, a clean copper surface was treated in a bath comprising 1.42 wt % $H_2O_2$, 0.06 wt % sodium phenolsulfonate, 8.61 wt % $H_2SO_4$, 0.57 wt % BTA, 0.0017 wt % (17 ppm) NaCl, 0.38 wt % polyethylene glycol, and deionized water. In Example 6, no coating stabilizer was used. The bath of Example 7 contained 1 ppm SDDC, the bath of Example 8 contained 5 ppm SDDC, the bath of Example 9 contained 10 ppm SDDC, the bath of Example 10 contained 50 ppm SDDC, and the bath of Example 11 contained 100 ppm SDDC. Peel strength testing demonstrated that the copper surfaces prepared in each of Examples 6–11 exhibited a desirable, tightly-adhering coating. While the data did not show a trend towards improved peel strength with increasing concentrations of coating stabilizer, the data did demonstrate that the use of a coating stabilizer does not negatively impact the peel strength of the roughened copper surface.

Following peel strength testing, the roughened copper surfaces of Examples 6–11 were laminated to an FR4 substrate using a pressure of 292 psi for 60 minutes at 350° F. (177° C.). Subsequent testing on hand-drilled holes through the laminated sandwiches demonstrated significant interconnect etch back for Examples 7 and 11, but none of the sandwiches exhibited any pink ring or wedge attack.

EXAMPLE 12

A clean copper surface was treated in a bath comprising 1.42 wt % $H_2O_2$, 0.06 wt % sodium phenolsulfonate, 8.61 wt % $H_2SO_4$, 0.57 wt % BTA, 0.0017 wt % (17 ppm) NaCl, 0.38 wt % polyethylene glycol, 1 ppm 2-mercaptothiazoline ("MTZ") (a coating stabilizer), balance deionized water (see Table 2). The bath temperature was maintained at 100° F. (38° C.). The copper surface was removed from the bath after one minute, rinsed with deionized water, and dried with an air hose. A roughened texture was observed on the copper surface, as is consistent with an alternative oxide coating process. Using an eye-dropper, a solution containing 15% by volume hydrochloric acid was applied to the roughened surface. The roughened surface dissolved over the course of 10–20 seconds, revealing bare copper beneath. The fact that the surface did not dissolve immediately demonstrates that the roughened surface was more chemically resistant than the roughened surface of Example 1, which was not prepared with a coating stabilizer.

EXAMPLE 13

A roughened copper surface was prepared in the same manner as Example 12, with the exception that the bath contained 5 ppm MTZ (see Table 2). Upon applying a 15% hydrochloric acid solution, the roughened surface dissolved over the course of 40–60 seconds, revealing bare copper beneath. The increased time for the roughened surface to dissolve demonstrates the improved chemical resistance of the surface.

EXAMPLE 14

A roughened copper surface was prepared in the same manner as Example 12, with the exception that the bath contained 20 ppm MTZ (see Table 2). Upon applying a 15% hydrochloric acid solution, the roughened surface dissolved over the course of 70–90 seconds, revealing bare copper beneath. Again, the increased time for the roughened surface to dissolve demonstrates the improved chemical resistance of the surface.

EXAMPLE 15

A roughened copper surface was prepared in the same manner as Example 12, with the exception that the bath contained 100 ppm MTZ (see Table 2). A 15% hydrochloric acid solution was applied to the roughened surface. After three to five minutes, the roughened surface was intact and no bare copper was visible. This demonstrates exceptional acid resistance compared to the surface of Example 1, which was prepared without a coating stabilizer.

See Table 2 for a summary of examples 12 to 15.

EXAMPLES 16 THROUGH 25

For examples 16 through 25, a clean copper surface is treated in a bath comprising 1.42 wt % $H_2O_2$, 0.06 wt % sodium phenolsulfonate, 8.61 wt % $H_2SO_4$, 0.57 wt % BTA, 0.0017 wt % (17 ppm) NaCl, 0.38 wt % polyethylene glycol, 100 ppm of a coating stabilizer, balance deionized water. The coating stabilizer used for each example is listed in Table 3. The copper surface is removed from the bath after one minute, rinsed with deionized water, and dried with an air hose. A roughened texture is observed on the copper surface, as is consistent with an alternative oxide coating process. Using an eye-dropper, a solution containing 15% by volume hydrochloric acid is applied to the roughened surface. The roughened copper surface of each of Examples 16 through 25 exhibits improved acid resistance compared to the surface of Example 1, which was prepared without a coating stabilizer.

EXAMPLES 26 THROUGH 31

In Examples 26 through 31, a clean copper surface is treated in a bath comprising 1.42 wt % $H_2O_2$, 0.06 wt % sodium phenolsulfonate, 8.61 wt % $H_2SO_4$, 0.0017 wt % (17 ppm) NaCl, 0.38 wt % polyethylene glycol, 100 ppm MTZ, a topography modifier, optionally a uniformity enhancer and/or coating promoter, balance deionized water. Table 4 lists the topography modifier and optional uniformity and/or coating promoter used in each of Examples 26 through 31.

The copper surface is removed from the bath after one minute, rinsed with deionized water, and dried with an air hose. A roughened texture is observed on the copper surface, as is consistent with an alternative oxide coating process. Using an eye-dropper, a solution containing 15% by volume hydrochloric acid is applied to the roughened surface. The roughened copper surface of each of Examples 26 through 31 is desirably uniformly etched and coated, and exhibits improved acid resistance compared to the surface of Example 1, which was prepared without a coating stabilizer.

EXAMPLE 32

A clean copper surface is treated in a bath comprising 1.42 wt % $H_2O_2$, 8.61 wt % $H_2SO_4$, 0.57 wt % BTA, 0.5 g/l 5-aminotetrazole (uniformity enhancer), 100 ppm MTZ, balance deionized water. The copper surface is removed from the bath after one minute, rinsed with deionized water, and dried with an air hose. A roughened texture is observed on the copper surface, as is consistent with an alternative oxide coating process. Using an eye-dropper, a solution containing 15% by volume hydrochloric acid is applied to the roughened surface. The roughened copper surface is desirably uniformly etched, and exhibits improved acid resistance compared to the surface of Example 1, which was prepared without a coating stabilizer.

EXAMPLE 33

A roughened copper surface was prepared in the same manner as Example 32, with the exception that 0.5 g/l 1-hydroxybenzotriazole (coating promoter) is used in the bath instead of 0.5 g/l 5-aminotetrazole (uniformity enhancer). The roughened copper surface is desirably coated, and exhibits improved acid resistance compared to the surface of Example 1, which was prepared without a coating stabilizer.

EXAMPLE 34

A clean copper surface was prepared by treating a substantially clean copper surface in a pre-dip bath at 70° F. (21° C.). The pre-dip bath comprised 1.15 wt % $H_2O_2$, 0.05 wt % sodium phenolsulfonate, 0.13 wt % $H_2SO_4$, 0.18 wt % BTA (1.8 g/l), balance deionized water. The clean copper surface was removed from the pre-dip bath after one minute.

The clean copper surface was then treated in a bath comprising 1.42 wt % $H_2O_2$, 0.06 wt % sodium phenolsulfonate, 8.61 wt % $H_2SO_4$, 0.57 wt % benzotriazole BTA, 0.0017 wt % NaCl, 0.38 wt % polyethylene glycol, balance deionized water. The bath temperature was maintained at 100° F. (38° C.). The copper surface was removed from the bath after one minute, rinsed with deionized water, and dried with an air hose. A roughened texture was observed on the copper surface, as is consistent with an alternative oxide coating process.

The roughened copper surface was then dipped into a post-treatment bath comprising 1 g/l disodium trithiocarbonate (an acid resistance promoting composition) and the balance deionized water. The bath temperature was maintained at room temperature. The roughened copper surface was removed from the bath after 15 seconds, rinsed with deionized water for 1 minute, and dried with an air hose.

Using an eye-dropper, a solution containing 15% by volume hydrochloric acid was applied to the roughened surface and left there for 15 seconds. On a scale of 1 to 10, where a rating of 1 indicates that the roughened copper surface has dissolved to reveal bare copper beneath, and where a rating of 10 indicates no difference between the surface before and after the acid test, this surface rated a 5. This demonstrates exceptional acid resistance compared to the roughened surface of Example 1, which dissolved immediately upon application of the acid solution (thus rating 1 on the scale of 1 to 10). Subsequent peel strength tests on a laminated portion of the roughened copper surface resulted in a peel strength value of 5.8 lbs/in.

EXAMPLES 35 THROUGH 43

For Examples 35 through 43, a roughened copper surface was prepared in the same manner as Example 34, with the exception that the composition and duration of the post-treatment bath was varied. Table 5 lists the particular acid resistance promoting composition used in the post-treatment bath in each example, along with the concentration, treatment time, peel strength test results and acid resistance test results. The test results for each of Examples 35 through 43 demonstrate exceptional acid resistance compared to the roughened surface of Example 1, which dissolved immediately upon application of the acid solution.

While the invention is described above in connection with preferred or illustrative embodiments and examples, they are not intended to be exhaustive or limiting of the invention. Rather, the invention is intended to cover all alternatives, modifications and equivalents included within its spirit and scope of the invention, as defined by the appended claims.

TABLE 1

|  | Example 1 | Example 2 | Example 3 | Example 4 | Example 5 |
| --- | --- | --- | --- | --- | --- |
| Oxidizer | 1.42 wt % $H_2O_2$ | 1.42 wt % $H_2O_2$ | 1.42 wt % $H_2O_2$ | 1.42 wt % $H_2O_2$ | 1.42 wt % $H_2O_2$ |
| $H_2O_2$ stabilizer | 0.06 wt % Sodium Phenolsulfonate | 0.06 wt % Sodium Phenolsulfonate | 0.06 wt % Sodium Phenolsulfonate | 0.06 wt % Sodium Phenolsulfonate | 0.06 wt % Sodium Phenolsulfonate |
| pH adjuster | 8.61 wt % sulfuric acid | 8.61 wt % sulfuric acid | 8.61 wt % sulfuric acid | 8.61 wt % sulfuric acid | 8.61 wt % sulfuric acid |
| Topography modifier | 0.57 wt % BTA (6 g/l) | 0.57 wt % BTA (6 g/l) | 0.57 wt % BTA (6 g/l) | 0.57 wt % BTA (6 g/l) | 0.57 wt % BTA (6 g/l) |

TABLE 1-continued

|  | Example 1 | Example 2 | Example 3 | Example 4 | Example 5 |
| --- | --- | --- | --- | --- | --- |
| Chloride ion | 0.0017 wt % (17 ppm) NaCl | 0.0017 wt % (17 ppm) NaCl | 0.0017 wt % (17 ppm) NaCl | 0.0017 wt % (17 ppm) NaCl | 0.0017 wt % (17 ppm) NaCl |
| Polyethylene Glycol | 0.38 wt % | 0.38 wt % | 0.38 wt % | 0.38 wt % | 0.38 wt % |
| Coating Stabilizer | None | 1 ppm SDDC | 5 ppm SDDC | 20 ppm SDDC | 100 ppm SDDC |
| D.I. water | Balance | Balance | Balance | Balance | Balance |
| Acid Resistance (Application of HCl solution) | Immediate appearance of bare copper | Bare copper visible in 10–20 seconds | Bare copper visible in 20–30 seconds | Bare copper visible in 50–70 seconds | No bare copper after 3–5 minutes |

TABLE 2

|  | Example 1 | Example 12 | Example 13 | Example 14 | Example 15 |
| --- | --- | --- | --- | --- | --- |
| Oxidizer | 1.42 wt % $H_2O_2$ | 1.42 wt % $H_2O_2$ | 1.42 wt % $H_2O_2$ | 1.42 wt % $H_2O_2$ | 1.42 wt % $H_2O_2$ |
| $H_2O_2$ stabilizer | 0.06 wt % Sodium Phenol- sulfonate | 0.06 wt % Sodium Phenol- sulfonate | 0.06 wt % Sodium Phenol- sulfonate | 0.06 wt % Sodium Phenol- sulfonate | 0.06 wt % Sodium Phenol- sulfonate |
| pH adjuster | 8.61 wt % sulfuric acid | 8.61 wt % sulfuric acid | 8.61 wt % sulfuric acid | 8.61 wt % sulfuric acid | 8.61 wt % sulfuric acid |
| Topography Modifier | 0.57 wt % BTA (6 g/l) | 0.57 wt % BTA (6 g/l) | 0.57 wt % BTA (6 g/l) | 0.57 wt % BTA (6 g/l) | 0.57 wt % BTA (6 g/l) |
| Chloride ion | 0.0017 wt % (17 ppm) NaCl | 0.0017 wt % (17 ppm) NaCl | 0.0017 wt % (17 ppm) NaCl | 0.0017 wt % (17 ppm) NaCl | 0.0017 wt % (17 ppm) NaCl |
| Polyethylene Glycol | 0.38 wt % | 0.38 wt % | 0.38 wt % | 0.38 wt % | 0.38 wt % |
| Coating Stabilizer | None | 1 ppm MTZ | 5 ppm MTZ | 20 ppm MTZ | 100 ppm MTZ |
| D.I. water | Balance | Balance | Balance | Balance | Balance |
| Acid Resistance (Application of HCl solution) | Immediate appearance of bare copper | Bare copper visible in 10–20 seconds | Bare copper visible in 40–60 seconds | Bare copper visible in 70–90 seconds | No bare copper after 3–5 minutes |

TABLE 3

| Example Number | Coating Stabilizer |
| --- | --- |
| Example 16 | 2-mercapto benzothiazole |
| Example 17 | 2,2'-dithiobis(benzothiazole) |
| Example 18 | 6-ethoxy-2-mercaptobenzothiazole |
| Example 19 | 3,4,5,6-tetrahydro-2-pyrimidinethiol |
| Example 20 | 2-imidazolidinethione |
| Example 21 | potassium 3-(thiocarbamoyl)-dithiocarbazate |
| Example 22 | sodium dimethyldithiocarbamate |
| Example 23 | tetraethylthiuram disulfide |
| Example 24 | tetramethylthiuram disulfide |
| Example 25 | 2,5-dithiobiurea |

TABLE 4

| Example Number | Topography Modifier | Uniformity Enhancer | Coating Promoter |
| --- | --- | --- | --- |
| Example 26 | 5 g/l 1H-indole | None | None |
| Example 27 | 4 g/l 6-nitro-1H- benzotriazole | None | None |
| Example 28 | 6 g/l 2-hydroxy-1H- benzimidazole | None | None |
| Example 29 | 0.57 wt % BTA | 0.5 g/l 5-amino- tetrazole | None |
| Example 30 | 0.57 wt % BTA | None | 0.5 g/l 1-hydroxybenzo-triazole |
| Example 31 | 0.57 wt % tolytriazole | 0.05 g/l 5-mercaptomethyl-tetrazole | 2 g/l 1-hydroxybenzo-triazole |

TABLE 5

|  | Post-Treatment Bath | Treatment Time | Peel Strength | Acid Re-sistance Rating* |
| --- | --- | --- | --- | --- |
| Example 1 | None | n/a | — | 1 |
| Example 34 | 1 g/l disodium trithiocarbonate | 15 seconds | 5.8 lbs/in | 5 |
| Example 35 | 1 g/l disodium trithiocarbonate | 30 seconds | 5.7 lbs/in | 7 |
| Example 36 | 1 g/l sodium sulfide | 15 seconds | 5.0 lbs/in | 9 |
| Example 37 | 1 g/l sodium sulfide | 30 seconds | 4.6 lbs/in | 9 |
| Example 38 | 1 g/l sodium N,N-dibutyldithiocarbamate | 30 seconds | 5.5 lbs/in | 5 |

TABLE 5-continued

| | Post-Treatment Bath | Treatment Time | Peel Strength | Acid Resistance Rating* |
|---|---|---|---|---|
| Example 39 | 1 g/l sodium dioctyldithiocarbamate | 30 seconds | 6.0 lbs/in | 6 |
| Example 40 | 0.5 g/l HQMME-xanthate and 0.5 g/l Na$_2$ trithiocarbonate | 15 seconds | 6.2 lbs/in | 5 |
| Example 41 | 0.5 g/l HQMME-xanthate and 0.5 g/l Na$_2$ trithiocarbonate | 30 seconds | 6.3 lbs/in | 5 |
| Example 42 | 0.5 g/l sodium N,N-dibutyldithiocarbamate and 0.5 g/l Na$_2$ trithiocarbonate | 15 seconds | 6.7 lbs/in | 5 |
| Example 43 | 1 g/l sodium N,N-dibutyldithiocarbamate | 30 seconds | 6.6 lbs/in | 4 |

*Acid resistance is rated on a scale of 1–10, where a rating of 1 indicates that the roughened copper surface has dissolved to reveal bare copper beneath, and where a rating of 10 indicates no difference between the surface before and after the acid test The claimed inventions are:

1. A process for preparing roughened copper surfaces suitable for subsequent multilayer lamination, said process comprising the steps of:
   contacting with a clean copper surface an adhesion promoting composition under conditions effective to provide a roughened copper surface, said adhesion promoting composition comprising an oxidizer, a pH adjuster, and a topography modifier; and
   contacting said roughened copper surface with an acid resistance promoting composition having a formula selected from the group consisting of:

wherein A is 1–20 and wherein $X_1$ is Mg, Ca, Li$_2$, Na$_2$, K$_2$, or (NH$_4$)$_2$;

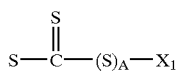

wherein A is 1–20 and wherein $X_1$ is Mg, Ca, Li$_2$, Na$_2$, K$_2$, or (NH$_4$)$_2$; and

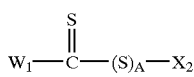

wherein $W_1$ is

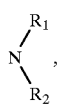

O—R$_3$, or S—R$_3$, wherein A is 1–20, wherein $X_2$ is Li, Na, K, NH$_4$,

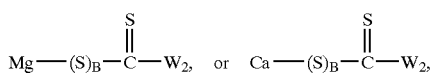

wherein $W_2$ is

O—R$_6$, or S—R$_6$, wherein B is 1–20, and wherein R$_{1-6}$ are independently selected from H and halogen, or wherein R$_{1-6}$ are independently selected from, or any two adjacent R$_{1-6}$ can be a linkage comprising S, epoxide, glycol, hydroxy, aryloxy, benzyloxy, alkoxy, haloalkoxy, amino, monoalkylamino, dialkylamino, heteroalkylamino, acyloxy, acyl, ketone, quinone, aldehyde, carbohydrate, organometallic, a C$_1$ up to C$_{18}$ alkyl which is linear or branched and may be singly or multiply substituted in singular or multiply bonded fashion, a cycloalkyl which may be singly or multiply substituted in singular or multiply bonded fashion, a heterocyclic which may be singly or multiply substituted in singular or multiply bonded fashion, a C$_1$ up to C$_{18}$ alkenyl which is linear or branched and may be singly or multiply substituted in singular or multiply bonded fashion, a C$_1$ up to C$_{18}$ alkadienyl which is linear or branched and may be singly or multiply substituted in singular or multiply bonded fashion, a C$_1$ up to C$_{18}$ alkynyl which is linear or branched and may be singly or multiply substituted in singular or multiply bonded fashion, an aryl which may be singly or multiply substituted in singular or multiply bonded fashion, a heteroaryl which may be singly or multiply substituted in singular or multiply bonded fashion, an alkylaryl which may be singly or multiply substituted in singular or multiply bonded fashion, an arylalkyl which may be singly or multiply substituted in singular or multiply bonded fashion, and combinations thereof, wherein the substituents are selected from the group consisting of halogen, epoxide, glycol, N, O, S, haloalkyl, hydroxy, aryloxy, benzyloxy, alkoxy, haloalkoxy, amino, monoalkylamino, dialkylamino, heteroalkylamino, acyloxy, acyl, ketone, quinone, aldehyde, carbohydrate, organometallic, alkyl, aryl, and combinations thereof.

2. The process according to claim 1, wherein said acid resistance promoting composition is selected from the group consisting of sodium dioctyldithiocarbamate, disodium trithiocarbonate, sodium sulfide, sodium N,N-dibutyldithiocarbamate and sodium hydroquinone monomethyl ether xanthate.

3. The process according to claim 2, wherein said acid resistance promoting composition is sodium sulfide.

4. The process according to claim 1, wherein A is 1–5.

5. The process according to claim 1, wherein the step of contacting said roughened copper surface with said acid resistance promoting composition is carried out in an aqueous solution.

6. The process according to claim 5, wherein said acid resistance promoting composition is present in said aqueous solution in the range between about 0.1 g/l and about 5 g/l.

7. The process according to claim 6, wherein said acid resistance promoting composition is present in said aqueous solution in the range between about 1 g/l and about 3 g/l.

8. The process according to claim 7, wherein said acid resistance promoting composition is present in said aqueous solution at about 1 g/l.

9. The process according to claim 1, wherein said acid resistance promoting composition is contacted with said roughened copper surface for between about 1 second to about 5 minutes.

10. The process according to claim 9, wherein said acid resistance promoting composition is contacted with said roughened copper surface for between about 5 seconds to about 2 minutes.

11. The process according to claim 1, wherein said acid resistance promoting composition is contacted with said roughened copper surface for at least about 1 second.

12. The process according to claim 1, wherein said clean copper surface is pretreated with a pretreatment composition comprising an oxidizer, a pH adjuster and a topography modifier.

13. The process of claim 12, wherein said oxidizer in said pretreatment composition is hydrogen peroxide.

14. The process of claim 13, wherein said pretreatment composition further comprises a hydrogen peroxide stabilizer.

15. The process according to claim 1, wherein said process is preceded with the optional steps of:
providing a substantially clean copper surface;
providing a pretreatment composition comprising an oxidizer, a pH adjuster and a topography modifier; and
contacting said substantially clean copper surface with said pretreatment composition under conditions effective to provide a clean copper surface.

16. A process according to claim 1, further comprising the step of rinsing said roughened copper surface with water prior to contacting the surface with said acid resistance promoting composition.

17. The process according to claim 1, wherein said adhesion promoting composition further comprises at least one of a uniformity enhancer and a coating promoter.

18. The process according to claim 1, wherein said oxidizer in said adhesion promoting composition is hydrogen peroxide.

19. The process according to claim 18, wherein said adhesion promoting composition further comprises a hydrogen peroxide stabilizer.

20. The process according to claim 19, wherein said hydrogen peroxide stabilizer is sodium phenolsulfonate.

21. The process according to claim 1, wherein said pH adjuster in said adhesion promoting composition is selected from the group consisting of sulfuric acid, phosphoric acid, acetic acid, formic acid, sulfamic acid, and hydroxy-acetic acid.

22. The process according to claim 21, wherein said pH adjuster in said adhesion promoting composition is sulfuric acid.

23. The process according to claim 1, wherein said pH adjuster is present in said adhesion promoting composition in the range between about 0.01% and about 20% by weight.

24. The process according to claim 23, wherein said pH adjuster is present in said adhesion promoting composition in the range between about 0.5% and about 10% by weight.

25. The process according to claim 1, wherein said topography modifier in said adhesion promoting composition is a 5-membered aromatic fused N heterocyclic compound, wherein said N heterocyclic ring has a nitrogen atom at position 1 bonded to a hydrogen atom.

26. The process according to claim 25, wherein said 5-membered aromatic fused N heterocyclic compound is selected from the group consisting of 1H-benzotriazole; 1H-indole; 1H-indazole; 1H-benzimidazole; 5-Methyl-1H-benzotriazole; 6-Nitro-1H-benzotriazole; 1H-naphtho(1,2-d)triazole; 1H-Naphtho[2,3-d]triazole; 5-Aminoindole; 6-methylindole; 1H-indole-5-methyl; 7-methylindol; 3-methylindole; 2-Methylindole; 1H-Indole, 3,5-dimethyl-; 2,3-Dimethylindole; 2,6-dimethylindole; 1H-Indazol-5-amine; 3-Chloro-1H-indazole; 2-Hydroxy-1H-benzimidazole; 2-Methyl-1H-benzimidazole; and 2-(methylthio)-1H-benzimidazole.

27. The process according to claim 1, wherein said topography modifier is present in said adhesion promoting composition in the range between about 0.1 g/l and about 20 g/l.

28. The process according to claim 27, wherein said topography modifier is present in said adhesion promoting composition in the range between about 0.5 g/l and about 7 g/l.

29. The process according to claim 1, wherein said adhesion promoting composition further comprises a halogen ion.

30. The process according to claim 29, wherein said halogen ion is chloride ion.

31. The process according to claim 29, wherein said halogen ion is present in said adhesion promoting composition in the range between about 1 ppm to about 100 ppm.

32. The process according to claim 1, wherein said adhesion promoting composition further comprises a water soluble polymer.

33. The process according to claim 32, wherein said water soluble polymer is present in said adhesion promoting composition in the range between about 0.5 wt % and about 3 wt %.

34. The process according to claim 32, wherein said water soluble polymer is a polyethylene glycol.

35. A process for preparing roughened copper surfaces suitable for subsequent multilayer lamination, said process comprising the steps of:
providing an adhesion promoting composition comprising an oxidizer, a pH adjuster, and a topography modifier;
providing an acid resistance promoting composition comprising a formula selected from the group consisting of:

wherein A is 1–20 and wherein $X_1$ is Mg, Ca, $Li_2$, $Na_2$, $K_2$, or $(NH_4)_2$;

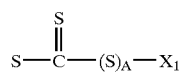

wherein A is 1–20 and wherein $X_1$ is Mg, Ca, $Li_2$, $Na_2$, $K_2$, or $(NH_4)_2$; and

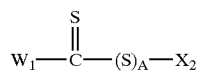

wherein $W_1$ is

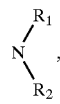

O—$R_3$, or S—$R_3$, wherein A is 1–20, wherein $X_2$ is Li, Na, K, $NH_4$,

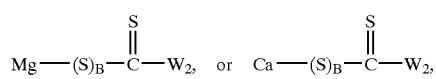

wherein $W_2$ is

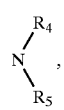

O—$R_6$, or S—$R_6$, wherein B is 1–20, and wherein $R_{1-6}$ are independently selected from H and halogen, or wherein $R_{1-6}$ are independently selected from, or any two adjacent $R_{1-6}$ can be a linkage comprising S, epoxide, glycol, hydroxy, aryloxy, benzyloxy, alkoxy, haloalkoxy, amino, monoalkylamino, dialkylamino, heteroalkylamino, acyloxy, acyl, ketone, quinone, aldehyde, carbohydrate, organometallic, a $C_1$ up to $C_{18}$ alkyl which is linear or branched and may be singly or multiply substituted in singular or multiply bonded fashion, a cycloalkyl which may be singly or multiply substituted in singular or multiply bonded fashion, a heterocyclic which may be singly or multiply substituted in singular or multiply bonded fashion, a $C_1$ up to $C_{18}$ alkenyl which is linear or branched and may be singly or multiply substituted in singular or multiply bonded fashion, a $C_1$ up to $C_{18}$ alkadienyl which is linear or branched and may be singly or multiply substituted in singular or multiply bonded fashion, a $C_1$ up to $C_{18}$ alkynyl which is linear or branched and may be singly or multiply substituted in singular or multiply bonded fashion, an aryl which may be singly or multiply substituted in singular or multiply bonded fashion, a heteroaryl which may be singly or multiply substituted in singular or multiply bonded fashion, an alkylaryl which may be singly or multiply substituted in singular or multiply bonded fashion, an arylalkyl which may be singly or multiply substituted in singular or multiply bonded fashion, and combinations thereof, wherein the substituents are selected from the group consisting of halogen, epoxide, glycol, N, O, S, haloalkyl, hydroxy, aryloxy, benzyloxy, alkoxy, haloalkoxy, amino, monoalkylamino, dialkylamino, heteroalkylamino, acyloxy, acyl, ketone, quinone, aldehyde, carbohydrate, organometallic, alkyl, aryl, and combinations thereof;

providing a clean copper surface;

contacting said clean copper surface with said adhesion promoting composition under conditions effective to form a roughened copper surface; and contacting said roughened copper surface with said acid resistance promoting composition.

36. The process according to claim 35, wherein said acid resistance promoting composition is selected from the group consisting of sodium dioctyldithiocarbamate, disodium trithiocarbonate, sodium sulfide, sodium N,N-dibutyldithiocarbamate and sodium hydroquinone monomethyl ether xanthate.

37. The process according to claim 35, wherein A is 1–5.

38. The process according to claim 35, wherein the step of contacting said roughened copper surface with said acid resistance promoting composition is carried out in an aqueous solution.

39. The process according to claim 38, wherein said acid resistance promoting composition is present in said aqueous solution in the range between about 0.1 g/l and 5 g/l.

40. The process according to claim 35, wherein said acid resistance promoting composition is contacted with said roughened copper surface for between about 1 second to about 5 minutes.

41. A copper surface adhesion promoting composition comprising an oxidizer, a pH adjuster, a topography modifier, and a coating stabilizer having the formula:

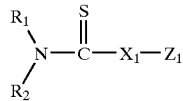

wherein $Z_1$ is Li, Na, K, $NH_4$, $R_3$,

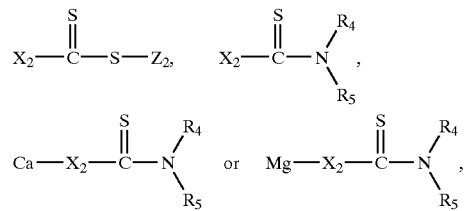

wherein $Z_2$ is Li, Na, K or $NH_4$, wherein $X_1$ is S or N—$R_6$, wherein $X_2$ is S or N—$R_7$, and wherein $R_{1-7}$ are independently selected from H and halogen, or wherein $R_{1-7}$ are independently selected from, or any two or more of $R_{1-7}$ can be a linkage comprising S, epoxide, glycol, hydroxy, aryloxy, benzyloxy, alkoxy, haloalkoxy, amino, monoalkylamino, dialkylamino, heteroalkylamino, acyloxy, acyl, ketone, quinone, aldehyde, carbohydrate, organometallic, a $C_1$ up to $C_{18}$ alkyl which is linear or branched and may be singly or multiply substituted in singular or multiply bonded fashion, a cycloalkyl which may be singly or multiply substituted in singular or multiply bonded fashion, a heterocyclic which may be singly or multiply substituted in singular or multiply bonded fashion, a $C_1$ up to $C_{18}$ alkenyl which is linear or branched and may be singly or multiply substituted in singular or multiply bonded fashion, a $C_1$ up to $C_{18}$ alkadienyl which is linear or branched and may be singly or multiply substituted in singular or multiply bonded fashion, a $C_1$ up to $C_{18}$ alkynyl which is linear or branched and may be singly or multiply substituted in singular or multiply bonded fashion, an aryl which may be singly or multiply substituted in singular or multiply bonded fashion, a heteroaryl which may be singly or multiply substituted in singular or multiply bonded fashion, an alkylaryl which may be singly or multiply substituted in singular or multiply bonded fashion, an arylalkyl which may be singly or multiply substituted in singular or multiply bonded fashion, and combinations thereof, wherein the substituents are selected from the group consisting of halogen, epoxide, glycol, N, O, S, haloalkyl, hydroxy, aryloxy, benzyloxy, alkoxy, haloalkoxy, amino, monoalkylamino, dialkylamino, heteroalkylamino, acyloxy, acyl, ketone, quinone, aldehyde, carbohydrate, organometallic, alkyl, aryl, and combinations thereof.

42. A copper surface adhesion promoting composition according to claim 41, wherein said coating stabilizer is selected from the group consisting of 2-imidazolidinethione; potassium 3-(thiocarbamoyl)-dithiocarbazate; sodium diethyldithiocarbamate; sodium dimethyldithiocarbamate; tetraethylthiuram disulfide; tetramethylthiuram disulfide; and 2,5-dithiobiurea.

43. A copper surface adhesion promoting composition according to claim 42, wherein said coating stabilizer is sodium diethyldithiocarbamate.

44. A copper surface adhesion promoting composition according to claim 41, wherein said coating stabilizer is present in the composition in the range between about 1 to about 1000 ppm.

45. A copper surface adhesion promoting composition according to claim 44, wherein said coating stabilizer is present in the composition in the range between about 2 to about 200 ppm.

46. A copper surface adhesion promoting composition according to claim 45, wherein said coating stabilizer is present in the composition in the range between about 50 to about 150 ppm.

* * * * *